(12) United States Patent
Kim et al.

(10) Patent No.: US 9,348,037 B2
(45) Date of Patent: May 24, 2016

(54) X-RAY PIXELS INCLUDING DOUBLE PHOTOCONDUCTORS AND X-RAY DETECTORS INCLUDING THE X-RAY PIXELS

(75) Inventors: Sang-wook Kim, Yongin-si (KR); Jae-chul Park, Suwon-si (KR); Sun-il Kim, Osan-si (KR); Chang-jung Kim, Yongin-si (KR)

(73) Assignee: Samsung Electronics Co., Ltd., Gyeonggi do (KR)

( * ) Notice: Subject to any disclaimer, the term of this patent is extended or adjusted under 35 U.S.C. 154(b) by 632 days.

(21) Appl. No.: 12/923,553

(22) Filed: Sep. 28, 2010

(65) Prior Publication Data

US 2011/0241143 A1     Oct. 6, 2011

(30) Foreign Application Priority Data

Apr. 1, 2010    (KR) .................. 10-2010-0029982

(51) Int. Cl.
    *H01L 31/08*    (2006.01)
    *G01T 1/24*     (2006.01)

(52) U.S. Cl.
    CPC .............. *G01T 1/242* (2013.01); *H01L 31/085* (2013.01)

(58) Field of Classification Search
    CPC ............ H01L 27/14676; H01L 31/085; H01L 27/14603; H01L 27/14601; H01L 31/1013; H01L 27/14659; H01L 31/115; H01L 27/14658; H01L 27/308
    See application file for complete search history.

(56) References Cited

U.S. PATENT DOCUMENTS

| | | | |
|---|---|---|---|
| 4,236,829 A | | 12/1980 | Chimamura et al. |
| 5,737,050 A | | 4/1998 | Takahara et al. |
| 5,994,713 A | * | 11/1999 | Becker et al. .................. 250/591 |
| 6,025,599 A | | 2/2000 | Lee et al. |
| 7,186,985 B2 | | 3/2007 | Iwanczyk et al. |
| 7,323,692 B2 | | 1/2008 | Rowlands et al. |
| 7,405,408 B2 | | 7/2008 | Vogtmeier et al. |
| 7,435,968 B2 | | 10/2008 | Watanabe et al. |
| 7,576,327 B2 | | 8/2009 | Okada |
| 7,589,324 B2 | | 9/2009 | Chen et al. |

(Continued)

FOREIGN PATENT DOCUMENTS

| | | |
|---|---|---|
| EP | 1120833 A2 | 8/2001 |
| EP | 1120833 A3 | 8/2001 |

(Continued)

OTHER PUBLICATIONS

Jan. 29, 2013 Office Action issued in U.S. Appl. No. 12/926,921.

(Continued)

*Primary Examiner* — Evan Pert
*Assistant Examiner* — Leslie Pilar Cruz
(74) *Attorney, Agent, or Firm* — Harness, Dickey & Pierce

(57) ABSTRACT

Example embodiments are directed to X-ray detectors including double photoconductors. According to example embodiments, the X-ray detector includes a first photoconductor on which X-rays are incident, and a second photoconductor on which X-rays transmitted through the first photoconductor are incident. The first photoconductor and the second photoconductor include a tandem structure. The first photoconductor is formed of silicon and absorbs X-rays in a low energy band, and the second photoconductor is formed of a material that absorbs X-rays in an energy band higher than the low energy band of the X-rays absorbed by silicon.

15 Claims, 5 Drawing Sheets

(56) References Cited

U.S. PATENT DOCUMENTS

| | | |
|---|---|---|
| 7,709,804 B2 | 5/2010 | Sakamoto et al. |
| 7,834,324 B2 | 11/2010 | Imai |
| 7,872,237 B2 | 1/2011 | Puhakka et al. |
| 8,497,483 B2 | 7/2013 | Puhakka et al. |
| 2001/0008271 A1 | 7/2001 | Ikeda et al. |
| 2002/0145116 A1 | 10/2002 | Choo et al. |
| 2003/0021382 A1 | 1/2003 | Iwanczyk et al. |
| 2004/0127038 A1 | 7/2004 | Carcia et al. |
| 2004/0178426 A1 | 9/2004 | Melekhov et al. |
| 2004/0256569 A1 | 12/2004 | Tokuda |
| 2005/0178970 A1 | 8/2005 | Amemiya et al. |
| 2005/0184320 A1 | 8/2005 | Green et al. |
| 2006/0054835 A1 | 3/2006 | Rowlands et al. |
| 2006/0158095 A1 | 7/2006 | Imamura |
| 2006/0192087 A1 | 8/2006 | Kuszpet et al. |
| 2007/0114430 A1 | 5/2007 | Imai et al. |
| 2008/0087835 A1 | 4/2008 | Okada |
| 2008/0245968 A1 | 10/2008 | Tredwell et al. |
| 2009/0026379 A1 | 1/2009 | Yaegashi et al. |
| 2009/0026382 A1 | 1/2009 | Sakamoto et al. |
| 2009/0110144 A1 | 4/2009 | Takahashi et al. |
| 2009/0152664 A1* | 6/2009 | Klem et al. .................. 257/440 |
| 2010/0044711 A1* | 2/2010 | Imai ................................ 257/59 |
| 2010/0072383 A1* | 3/2010 | Okada ...................... 250/370.09 |
| 2011/0049375 A1 | 3/2011 | Kameshima et al. |
| 2011/0156273 A1 | 6/2011 | Puhakka et al. |
| 2011/0240869 A1 | 10/2011 | Kim et al. |
| 2011/0309259 A1 | 12/2011 | Kim et al. |
| 2012/0146016 A1 | 6/2012 | Park et al. |
| 2012/0181440 A1 | 7/2012 | Kim et al. |
| 2012/0223241 A1 | 9/2012 | Kim et al. |

FOREIGN PATENT DOCUMENTS

| | | |
|---|---|---|
| EP | 1978563 A2 | 10/2008 |
| EP | 1978563 A3 | 10/2012 |
| JP | 01-114782 A | 5/1989 |
| JP | 08289886 A | 11/1996 |
| JP | 1990253186 | 5/1999 |
| JP | 2005183454 A | 7/2005 |
| JP | 2006049773 A | 2/2006 |
| JP | 2007-324470 A | 12/2007 |
| JP | 2009-031159 A | 2/2009 |
| JP | 2009-032854 A | 2/2009 |
| JP | 2009-131564 A | 6/2009 |
| KR | 20050056234 A | 6/2005 |
| KR | 100767384 B1 | 10/2007 |
| KR | 20080105518 A | 12/2008 |
| KR | 20090131773 A | 12/2009 |
| KR | 20100044451 A | 4/2010 |
| WO | WO-2004/038810 A2 | 5/2004 |
| WO | WO-2004/038810 A3 | 5/2004 |

OTHER PUBLICATIONS

U.S. Office Action dated Jun. 24, 2013, in co-pending U.S. Appl. No. 12/926,921.
U.S. Office Action dated Aug. 22, 2013, in copending U.S. Appl. No. 13/247,512.
U.S. Office Action dated Dec. 10, 2013 issued in U.S. Appl. No. 12/926,921.
U.S. Advisory Action dated Oct. 31, 2013 issued in U.S. Appl. No. 12/926,921.
Extended European Search Report dated Feb. 7, 2014, issued in Application No. 11192248.0.
Korean Office Action and English translation thereof dated Dec. 7, 2015.

* cited by examiner

X-RAY PIXELS INCLUDING DOUBLE PHOTOCONDUCTORS AND X-RAY DETECTORS INCLUDING THE X-RAY PIXELS

CROSS-REFERENCE TO RELATED APPLICATIONS

This application claims priority under 35 U.S.C. §119 to Korean Patent Application No. 10-2010-0029982, filed on Apr. 1, 2010, in the Korean Intellectual Property Office, the disclosure of which is incorporated herein in its entirety by reference.

BACKGROUND

1. Field

Example embodiments relate to X-ray pixels of flat panel X-ray detectors that directly detect double energy X-rays by using different photoconductors.

2. Description of the Related Art

A digital X-ray detector outputs an X-ray image and/or an X-ray penetration image captured by using an X-ray as a digital signal. The digital X-ray detector uses a direct method and/or an indirect method.

In the direct method, an X-ray is converted directly into electric charges by using, for example, a photoconductor. In the indirect method, an X-ray is converted into a visible ray by using, for example, a scintillator, and then the converted visible ray is further converted into electric charges by using a light conversion device such as a photodiode.

With regard to a flat panel X-ray detector, when an X-ray is emitted on/transmitted to/incident on each pixel of a pixel array, electrical charges are generated in a photoconductor, and the flat panel X-ray detector measures the amount of electrical charges generated so as to realize an image.

A medical image capturing apparatus distinguishes materials having different transmittance with respect to an X-ray in order to produce an image. Generally, the flat panel X-ray detector outputs a single signal with respect to each pixel.

However, a medical subject may include different materials. For example, cancer tissue and normal tissue, or hard tissue and soft tissue have excellent sensitivities with respect to different X-rays. Accordingly, when different X-rays are transmitted through different tissues, the different tissues may be accurately detected by the different X-rays, respectively. In such a manner, relatively higher quality images of the tissues may be obtained.

SUMMARY

According to example embodiments, a pixel of an X-ray detector, the pixel includes a first photoconductor configured to generate electron-hole pairs in response to X-rays incident on the first photoconductor; a first electrical circuit configured to detect at least one electron or hole generated by the first photoconductor and convert the electron or hole into a first electrical signal; a second photoconductor on the first photoconductor, the second photoconductor configured to generate electron-hole pairs in response to X-rays transmitted through the first photoconductor; and a second electrical circuit configured to detect at least one electron or hole generated by the second photoconductor and convert the electron or hole into a second electrical signal, wherein the X-rays incident on the first photoconductor are of a lower energy band compared to the X-rays incident on the second photoconductor.

According to example embodiments, the first photoconductor includes silicon.

According to example embodiments, the pixel further includes a first common electrode and a first pixel electrode respectively on opposite surfaces of the first photoconductor, wherein the first electrical circuit includes a first capacitor and a first transistor, and is electrically connected to the first pixel electrode.

According to example embodiments, the pixel further includes a second common electrode and a second pixel electrode respectively on opposite surfaces of the second photoconductor, wherein the second electrical circuit includes a second capacitor and a second transistor, and is electrically connected to the second pixel electrode.

According to example embodiments, the second photoconductor layer includes at least one selected from a group consisting of amorphous selenium (a-Se), $HgI_2$, $PbI_2$, CdTe, CdZnTe, and PbO.

According to example embodiments, the pixel further includes X-ray blocking layers below the first transistor and the second transistor and respectively corresponding to the first transistor and the second transistor, the X-ray blocking layers configured to block X-rays from being incident on the first transistor and the second transistor.

According to example embodiments, the first photoconductor layer includes the X-ray blocking layers.

According to example embodiments, the X-ray blocking layers include lead (Pb).

According to example embodiments, a channel of each of the first transistor and the second transistor includes of any one of amorphous silicon, polysilicon, and an oxide semiconductor.

According to example embodiments, the oxide semiconductor includes ZnO, or a compound including ZnO and at least one selected from a group consisting of gallium (Ga), indium (In), hafnium (Hf), tin (Sn), tantalum (Ta), and yttrium (Y).

According to example embodiments, the first transistor and the second transistor are respectively on opposite surfaces of the second photoconductor.

According to example embodiments, the first transistor and the second transistor are on a same surface of the second photoconductor.

According to example embodiments, the pixel further includes an X-ray blocking layer in the first photoconductor, the X-ray blocking layer configured to block X-rays from being incident on the first transistor and the second transistor.

According to example embodiments, the X-ray blocking layer includes lead (Pb).

According to example embodiments, the pixel further includes a substrate including the second transistor and the second capacitor on the substrate, the substrate facing the second photoconductor layer, the second transistor and the second capacitor.

According to example embodiments, the pixel further includes a substrate including the first capacitor and the second capacitor on the substrate, the substrate facing the second photoconductor layer, the first and second transistors and the first and second capacitors.

According to example embodiments, the first photoconductor and the second photoconductor include a tandem structure.

According to example embodiments, an x-ray detector includes the example pixel.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
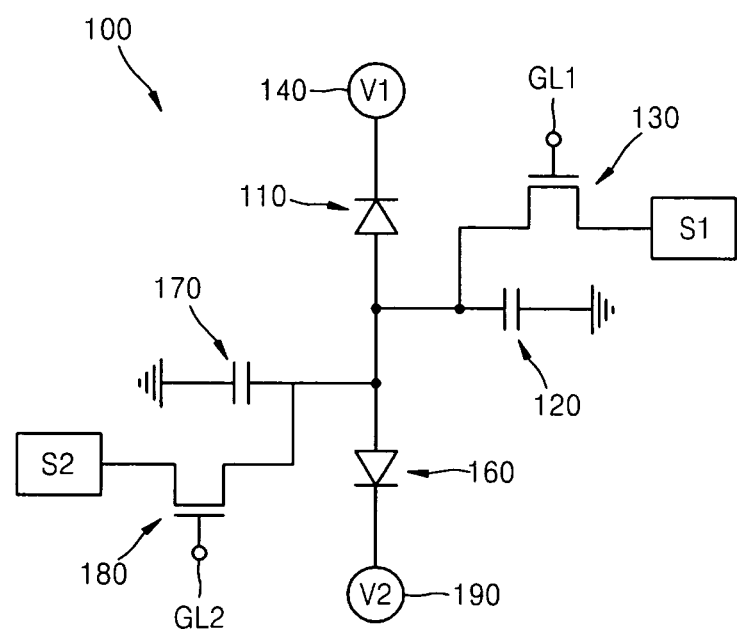
FIG. 1 is circuit diagram of an X-ray detector including double photoconductors according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a circuit diagram of an X-ray detector 100 including double photoconductors according to example embodiments. The X-ray detector 100 includes a plurality of pixels that are arranged in an array, and FIG. 1 is a circuit diagram of one of the plurality of pixels of the X-ray detector 100.

Referring to FIG. 1, each pixel of the X-ray detector 100 includes first and second photoconductors 110 and 160. The first and second photoconductors 110 and 160 may constitute a stack structure, for example, a tandem structure that will be described later.

A first capacitor 120 and a first switching transistor 130 are connected to the first photoconductor 110. A first signal processor 51 is connected to the first switching transistor 130. A first gate line GL1 is connected to a gate electrode of the first switching transistor 130. A first voltage source 140 is connected to the first photoconductor 110 to generate an electric field in the first photoconductor 110. The first capacitor 120 and the first switching transistor 130 may be collectively referred to as a first electric circuit. The first electric circuit is electrically connected to a first pixel electrode of the first photoconductor 110, which will be described later. The first electric circuit detects electrons and/or holes that are generated in the first photoconductor 110, and outputs an electrical signal.

A second capacitor 170 and a second switching transistor 180 are connected to the second photoconductor 160. A second signal processor S2 is connected to the second switching transistor 180. A second gate line GL2 is connected to a gate electrode of the second switching transistor 180. A second voltage source 190 is connected to the second photoconductor 160 so as to generate an electric field in the second photoconductor 160. The second capacitor 170 and the second switching transistor 180 may be collectively referred to as a second electric circuit. The second electric circuit is electrically connected to a second pixel electrode of the second photoconductor 160, which will be described later. The second electric circuit detects electrons and/or holes that are generated in the second photoconductor 160, and outputs an electrical signal.

The first and second switching transistors 130 and 180 may each be replaced with another switching element, for example, a diode.

Double energy X-rays are an X-ray set containing an X-ray in a low energy band ('low energy X-ray') and an X-ray in a high energy band ('high energy X-ray'). For example, the low energy X-ray may have a low energy of about 1 to about 30 keV, and a photoconductor using the low energy X-ray may be formed of silicon (Si), for example. The high energy X-ray may have a high energy of about 20 to about 50 keV, and a photoconductor using the high energy X-ray may be formed of a material with a higher X-ray absorption efficiency with respect to a high energy band, than that of Si, such as amorphous selenium (a-Se), $HgI_2$, $PbI_2$, PbO, CdTe, CdZnTe, a combination thereof or the like.

Figure 2:
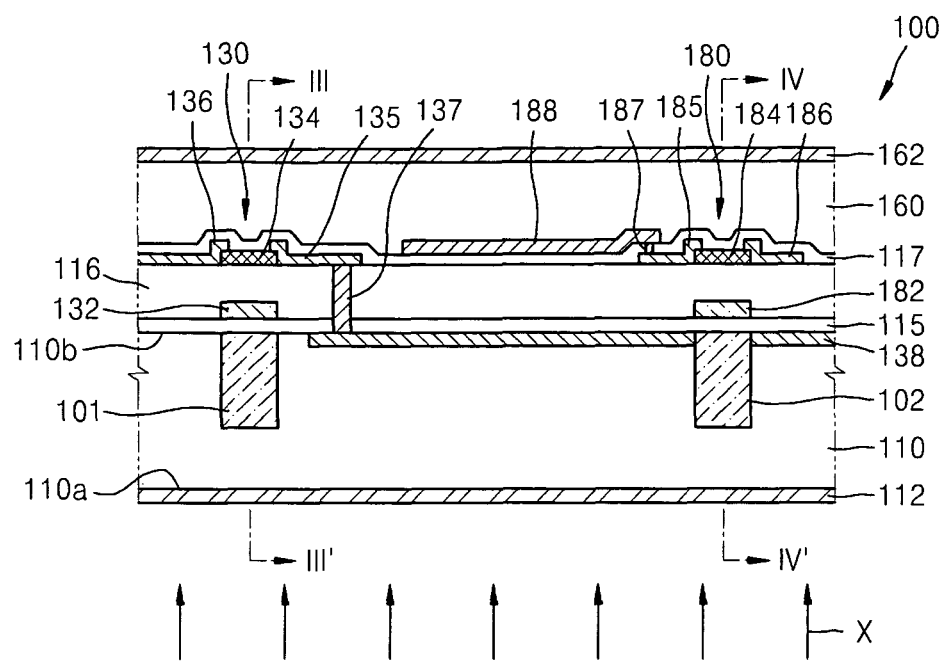
FIG. 2 is a cross-sectional view of a pixel of the X-ray detector of FIG. 1.
Figure 3:
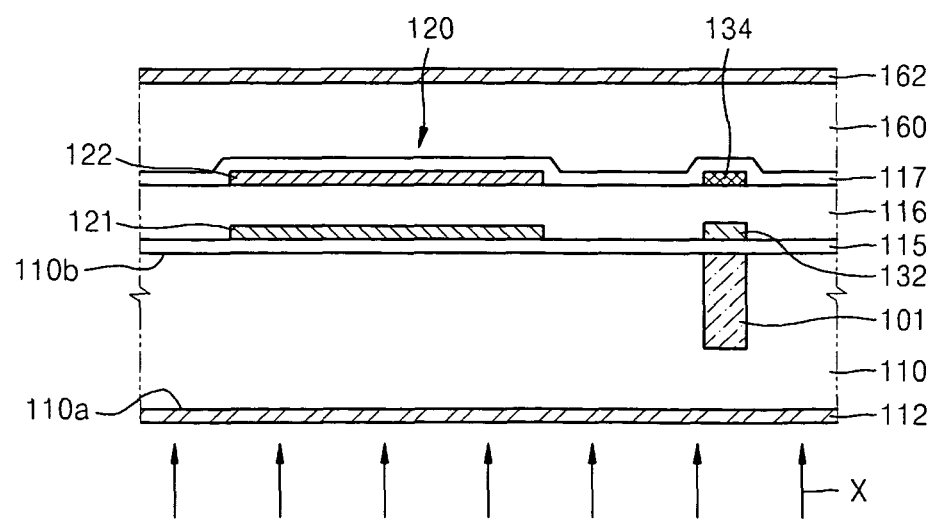
FIG. 3 is a cross-sectional view of the pixel of the X-ray detector taken along a line III-III' of FIG. 2.
Figure 4:
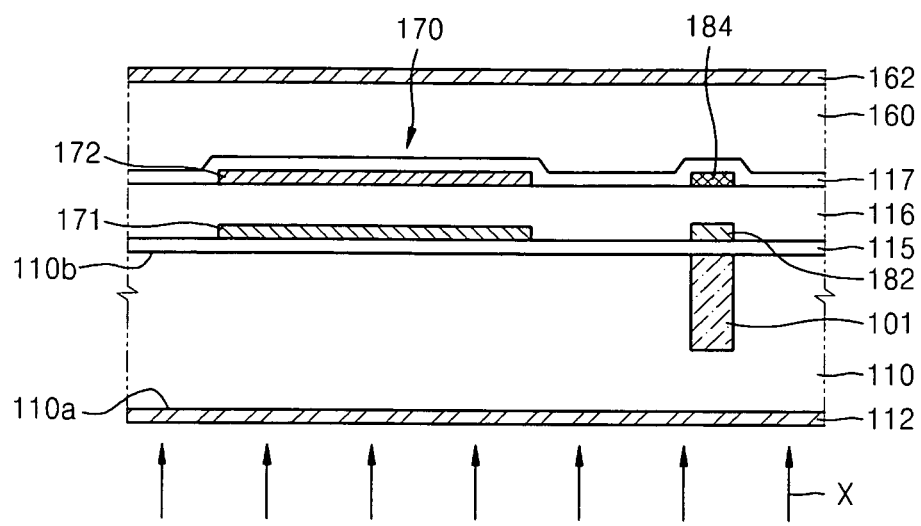
FIG. 4 is a cross-sectional view of the pixel of the X-ray detector taken along a line IV-IV' of FIG. 2.

FIG. 2 is a cross-sectional view of a pixel of the X-ray detector 100 of FIG. 1, according to example embodiments. FIG. 3 is a cross-sectional view of the pixel of the X-ray detector 100 taken along a line of FIG. 2, according to example embodiments. FIG. 4 is a cross-sectional view of the pixel of the X-ray detector 100 taken along a line IV-IV' of FIG. 2, according to example embodiments. The reference numerals in FIGS. 2-4 same as those in FIG. 1 refer to the same element(s) as in FIG. 1, and thus their detailed description will not be repeated.

Referring to FIG. 2, a first common electrode 112 is formed on a first surface 110a of a first photoconductor layer 110 which is a silicon substrate. X-rays are incident on the first surface 110a. The first common electrode 112 may be formed of a transparent oxide such as an indium tin oxide (ITO), and may be formed by depositing metal such as molybdenum (Mo), aluminum (Al) or copper (Cu) to a thickness of about 100 to about 300 nm. A first pixel electrode 138 is formed on a second surface 110b of the first photoconductor layer 110. The first pixel electrode 138 is formed of metal such as Mo, Al or Cu.

A first insulating layer 115 is formed on the first pixel electrode 138. A first gate electrode 132 and a second gate electrode 182 are formed on the first insulating layer 115 so as to be spaced apart from each other. Referring to FIGS. 2-4, a first electrode 121 of the first capacitor 120 and a first electrode 171 of the second capacitor 170 are formed on the first insulating layer 115 so as to be at the same vertical position with the first gate electrode 132 and the second gate electrode 182, respectively. The first gate electrode 132, the second gate electrode 182, and the first electrodes 121 and 171 may be simultaneously formed by depositing and pattering the same or different material on the first insulating layer 115.

A second insulating layer 116 is formed on the first insulating layer 115 so as to cover the first gate electrode 132 and the second gate electrode 182. The first insulating layer 115 and the second insulating layer 116 may each be formed of silicon oxide, silicon nitride, silicon oxynitride, alumina, hafnium oxide a combination thereof, or the like.

A first channel 134 and a second channel 184 are formed on the second insulating layer 116. The first channel 134 and the second channel 184 are formed to correspond to the first gate electrode 132 and the second gate electrode 182, respectively. The first channel 134 and the second channel 184 may be formed of amorphous silicon, polysilicon, an oxide semiconductor, a combination thereof, or the like. Examples of the oxide semiconductor may include ZnO, or a compound formed by mixing ZnO with at least one selected from the group consisting of gallium (Ga), indium (In), hafnium (Hf), and tin (Sn).

A first source electrode 135 and a first drain electrode 136 that cover both ends of the first channel 134, and a second source electrode 185 and a second drain electrode 186 that cover both ends of the second channel 184 are formed on the second insulating layer 116, respectively. Simultaneously, a second electrode 122 of the first capacitor 120, and a second electrode 172 of the second capacitor 170 may be formed on the second insulating layer 116.

A first blocking layer 101 and a second blocking layer 102 that respectively protect a first transistor 130 and a second transistor 180 from X-rays may be formed in the first photoconductor layer 110. The first blocking layer 101 and the second blocking layer 102 may be formed of lead (Pb), for example.

The first pixel electrode 138 is electrically connected to the first source electrode 135 through a conductive plug 137. The conductive plug 137 connects the first pixel electrode 138 and the first source electrode 135 to each other while filling a via hole formed through the first insulating layer 115 and the second insulating layer 116. The first drain electrode 136 is connected to the first signal processor S1 (see FIG. 1).

A passivation layer 117 covering the first transistor 130, the second transistor 180, the first capacitor 120 and the second capacitor 170 may be formed on the second insulating layer 116.

A second pixel electrode 188 is formed on the passivation layer 117. The second pixel electrode 188 is connected to the second source electrode 185 through a conductive plug 187. The conductive plug 187 connects the second pixel electrode 188 and the second source electrode 185 to each other while filling a via hole formed through the passivation layer 117. The second drain electrode 186 is connected to the second signal processor S2 (see FIG. 1).

The second insulating layer 116 acts as a gate oxide between the first gate electrode 132 and the first channel 134 at the first transistor 130, and acts as a gate oxide between the second gate electrode 182 and the second channel 184 at the second transistor 180. The second insulating layer 116 acts as a dielectric between the first electrode 121 and the second electrode 122 of the first capacitor 120, and also acts as a dielectric between the first electrode 171 and the second electrode 172 of the second capacitor 170.

The second photoconductor 160 covering the first transistor 130 and the second transistor 180 is formed on the passivation layer 117. A second common electrode 162 is formed on the second photoconductor 160.

A positive voltage of several tens of volts may be applied to the first common electrode 112. Then, electron-hole pairs are generated in the first photoconductor 110 by absorbing a low energy X-ray, and holes of the electron-hole pairs move to the first pixel electrode 138.

A voltage applied to the second common electrode 162 may vary according to a material of the first photoconductor layer 110. When the second photoconductor 160 is formed of a-Se, CdTe, or CdZnTe, a positive voltage is applied to the second common electrode 162, and holes move to the second pixel electrode 188. When the second photoconductor 160 is formed of $HgI_2$, PbO, or $PbI_2$, a negative voltage is applied to the second common electrode 162, and electrons are mainly collected by the second pixel electrode 188.

Hereinafter, with reference to FIGS. 1 through 4, an operation of the X-ray detector 100 will be described.

Low-energy X-rays of X-rays incident on the first common electrode 112 are absorbed by the first photoconductor layer 110 formed of silicon. Electron-hole pairs are generated in the first photoconductor layer 110. A negative voltage of several tens of volts is applied to the first common electrode 112 to generate an electrical field in the first photoconductor layer 110. Electrons generated by the first photoconductor layer 110 move to the first pixel electrode 138. Then, the electrons move to the first capacitor 120, and are stored in the first capacitor 120. When the first transistor 130 is turned-on through the first gate line GL1 (see FIG. 1), the electric charges (electrons) stored in the first capacitor 120 move to the first signal processor S1 (see FIG. 1).

High-energy X-rays of X-rays incident on the first photoconductor layer 110 pass through the first photoconductor layer 110, and absorbed by the second photoconductor 160. Electric charges moving to the second pixel electrode 188 are determined as electrons or holes according to a material of the second photoconductor 160. When the second photoconductor 160 is formed of a-Se, a positive voltage of several kilovolts (kV) is applied to the second common electrode 162, and accordingly holes generated by the second photoconductor 160 move to the second pixel electrode 188, and are stored in the second capacitor 170. When the second transistor 180 is turned-on through the second gate line GL2 (see FIG. 1), the electric charges (holes) stored in the second capacitor 170 move to the second signal processor S2.

The first signal processor S1 and the second signal processor S2 are illustrated as two elements in FIG. 1, or alternatively, may constitute a single element.

The first signal processor S1 and the second signal processor S2 measure the amount of electric charges generated from the first capacitor 120 and the second capacitor 170, respectively, and provide image information of respective pixels regarding different tissues. An image of each pixel may be realized by using one photoconductor layer for accurately detecting tissue of a corresponding region, or by using both photoconductor layers.

Figure 5:
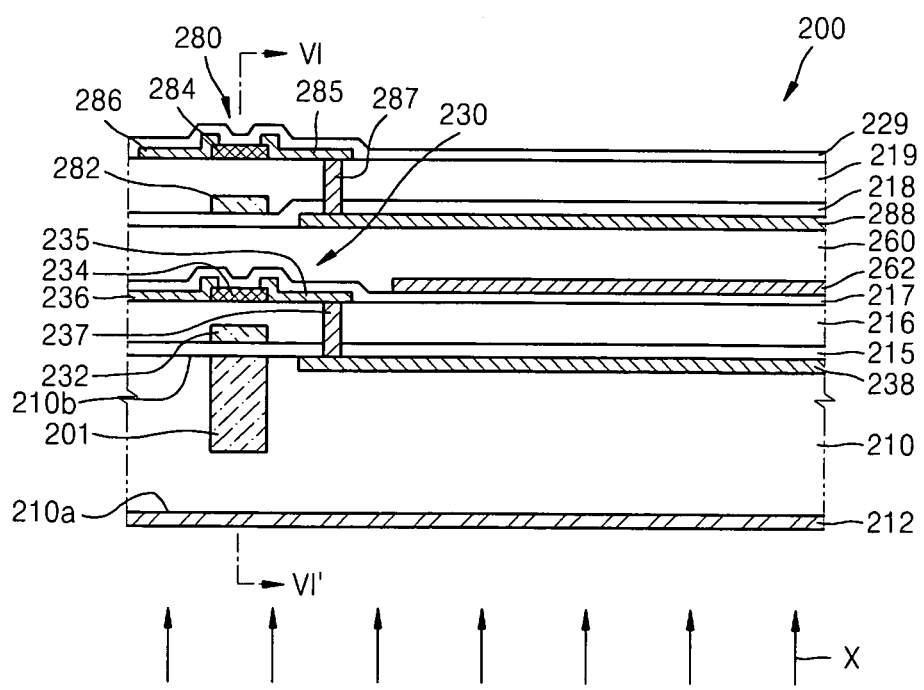
FIG. 5 is a cross-sectional view of a pixel of an X-ray detector, according to example embodiments.
Figure 6:
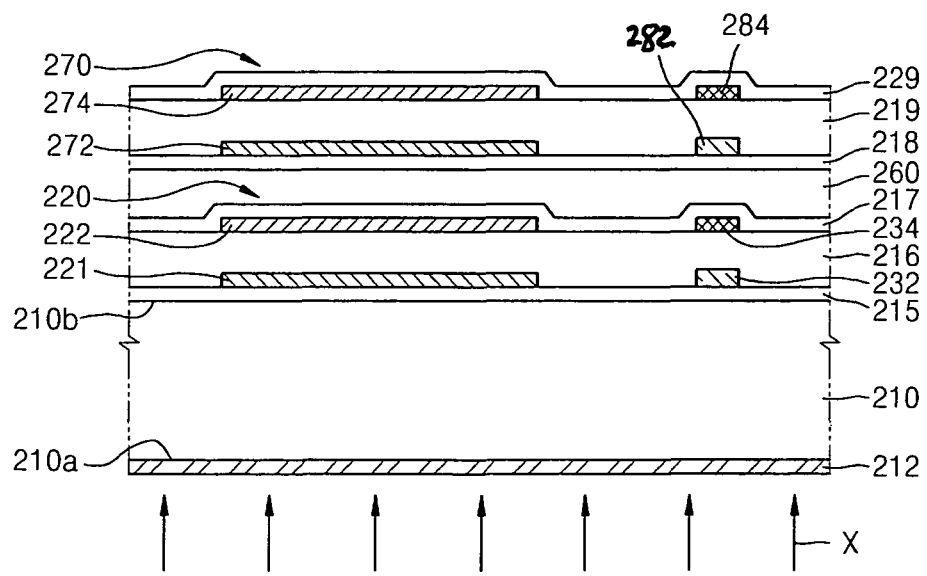
FIG. 6 is a cross-sectional view of the pixel of the X-ray detector taken along a line VI-VI' of FIG. 5.

FIG. 5 is a cross-sectional view of a pixel of an X-ray detector 200, according to example embodiments. FIG. 6 is a cross-sectional view of the X-ray detector 200 taken along a line VI-VI' of FIG. 5.

Referring to FIGS. 5 and 6, a first common electrode 212 is formed on a first surface 210a of a first photoconductor layer 210 which is a silicon substrate, for example. X-rays 'X' are incident on the first surface 210a. The first common electrode 212 may be formed of a transparent oxide such as indium tin oxide (ITO), or alternatively, may be formed by depositing metal such as Mo, Al, or Cu to a thickness of about 100 to about 3000 nm. A first pixel electrode 238 is formed on a second surface 210b of the first photoconductor layer 210. The first pixel electrode 238 is formed of metal such as Mo, Al, Cu, a combination thereof or the like.

A first insulating layer 215 is formed on the first pixel electrode 238. A first gate electrode 232 and a first electrode 221 of a first capacitor 220 are formed on the first insulating layer 215. A second insulating layer 216 covering the first gate electrode 232 and the first electrode 221 is formed on the first insulating layer 215.

A first channel 234 is formed on the second insulating layer 216. A first source electrode 235 and a first drain electrode 236 that cover both ends of the first channel 234, and a second electrode 222 of the first capacitor 220 are formed on the second insulating layer 216. The first source electrode 235 is connected to the first pixel electrode 238 through a conductive plug 237 formed in a via hole passing through the first and second insulating layers 215 and 216. The first capacitor 220 is electrically connected to the first pixel electrode 238. For example, the first electrode 221 may extend to be connected to the first source electrode 235.

A first passivation layer 217 covering a first transistor 230 is formed on the second insulating layer 216. A second common electrode 262 is formed on the first passivation layer 217. A second photoconductor layer 260 covering the second common electrode 262 is formed on the first passivation layer 217. The second photoconductor layer 260 may be formed of a-Se, HgI$_2$, PbI$_2$, PbO, CdTe, CdZnTe, combination thereof or the like.

A blocking layer 201 for protecting the first transistor 230 from X-rays may be formed in the first photoconductor layer 210. The blocking layer 201 may be formed of lead (Pb).

A second pixel electrode 288 is formed on the second photoconductor layer 260, and a third insulating layer 218 is formed on second pixel electrode 288. A second gate electrode 282, and a first electrode 272 of a second capacitor 270 are formed on the third insulating layer 218. A fourth insulating layer 219 covering the second gate electrode 282 and the first electrode 272 is formed on the third insulating layer 218.

A second channel 284 is formed on the fourth insulating layer 219. On the fourth insulating layer 219, a second source electrode 285 and a second drain electrode 286 are formed on both ends of the second channel 284, and a second electrode 274 of the second capacitor 270 are formed on the fourth insulating layer 219. The second source electrode 285 is electrically connected to the second pixel electrode 288 through a conductive plug 287 filling a via hole formed through the third and fourth insulating layers 218 and 219. A second passivation layer 229 covering a second transistor 280 may be formed on the fourth insulating layer 219.

Since the X-ray detector 200 includes the first transistor 230 and the second transistor 280 that are vertically arranged with respect to the first photoconductor layer 210, only one blocking layer 201 may be used. In addition, since the first transistor 230 and the second transistor 280 are vertically arranged, an aperture ratio of the X-ray detector 200 may be increased.

An operation of the X-ray detector 200 may be somewhat similar to the operation of the X-ray detector 100, and thus its detailed description will be omitted for the sake of brevity.

Figure 7:
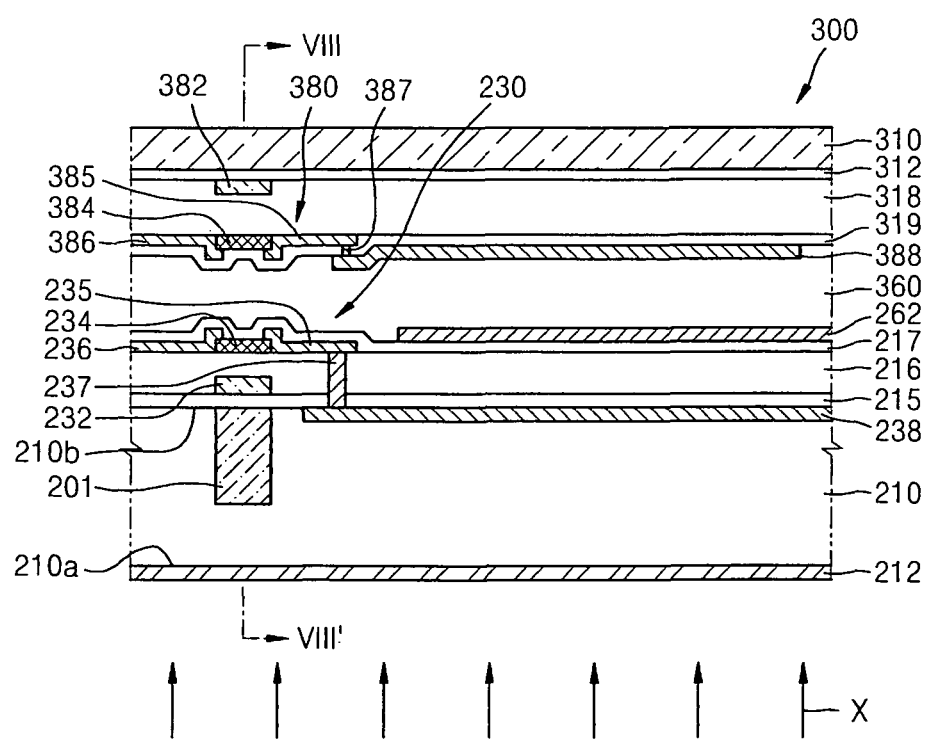
FIG. 7 is a cross-sectional view of a pixel of the X-ray detector according to example embodiments.
Figure 8:
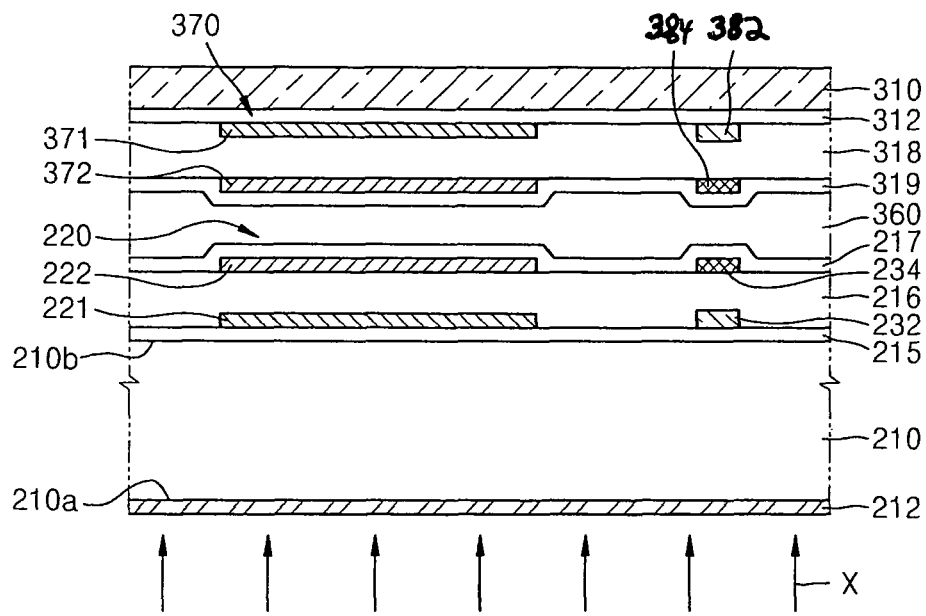
FIG. 8 is a cross-sectional view of the pixel of the X-ray detector taken along a line VIII-VIII' of FIG. 7.

FIG. 7 is a cross-sectional view of a pixel of an X-ray detector 300 according to example embodiments. FIG. 8 is a cross-sectional view of the pixel of the X-ray detector 300 taken along a line VIII-VIII' of FIG. 7. The same reference numerals in FIGS. 7-8 as those in FIGS. 5 and 6 refer to the same elements as in FIGS. 5 and 6, and thus their detailed description will be omitted for the sake of brevity.

The X-ray detector 300 of FIGS. 7 and 8 includes a substrate 310 other than a silicon substrate that is actually used as the first photoconductor layer 210. The substrate 310 is formed of glass, silicon, plastic, or the like. The first transistor 230 and the first capacitor 220 are formed on the first photoconductor layer 210. A second transistor 380 and a second capacitor 370 are formed on the substrate 310. Then, a material used for forming a second photoconductor layer 360 is filled between the first photoconductor layer 210 and the substrate 310, and the second photoconductor layer 360 is heated. Thus, the second photoconductor layer 360 functions as a bonding layer between the first photoconductor layer 210 and the substrate 310. A melting point of the second photoconductor layer 360 may vary according to a material thereof. When the second photoconductor layer 360 is formed of a-Se, since the second photoconductor layer 360 is melted at a temperature of about 100° C. or less, the substrate 310 and the first photoconductor layer 210 may be bonded to each other at a low temperature.

Referring to FIGS. 7 and 8, the structures of the first photoconductor layer 210 through the second photoconductor layer 360 are materially the same configuration as those of FIGS. 5 and 6.

A third insulating layer 312 is formed on the substrate 310. A second gate electrode 382 together with a first electrode 371 of the second capacitor 370 is formed on the third insulating layer 312. A fourth insulating layer 318 covering the second gate electrode 382 and the first electrode 371 is formed on the third insulating layer 312. A second channel 384 is formed on the fourth insulating layer 318 so as to correspond to a first channel 234. A second source electrode 385 and a second drain electrode 386 that cover both ends of the second channel 384, and a second electrode 372 of the second capacitor 370 are formed on the fourth insulating layer 318. A second passivation layer 319 covering the second transistor 380 and the second capacitor 370 is formed on the fourth insulating layer 318. A second pixel electrode 388 is formed on the second passivation layer 319. The second pixel electrode 388 is connected to the second source electrode 385 through a conductive plug 387 filing a via hole formed through the second passivation layer 319.

Compared with the X-ray detector 200 of FIG. 5, the X-ray detector 300 of FIG. 7 includes a separate structure including the second transistor 380 and the first transistor 230, respectively, and the second photoconductor layer 360 is used as a bonding layer therebetween at a relatively low temperature. Thus, the second photoconductor layer 360 may be prevented from being damaged due to heat used when a transistor is manufactured at a relatively high temperature.

However, example embodiments are not limited thereto. The second transistor 380 may not be positioned above the first transistor 230. Such a second transistor that is not above the first transistor 230 may require a separate blocking layer to protect the second transistor 380 from X-rays.

Figure 9:
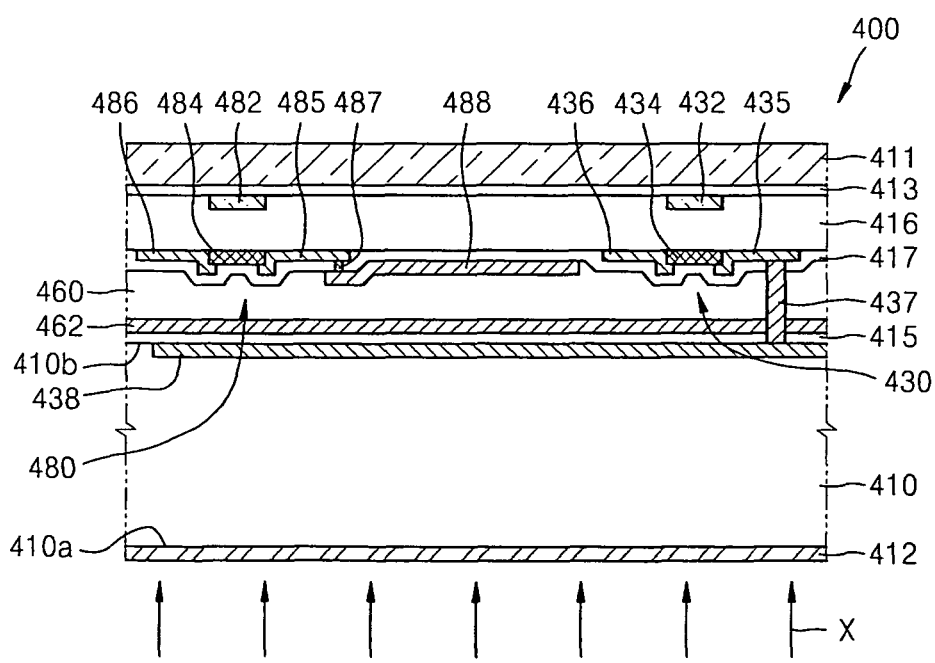
FIG. 9 is a cross-sectional view of a pixel of an X-ray detector according to example embodiments.

FIG. 9 is a cross-sectional view of an X-ray detector 400 according to example embodiments. Structures of a first capacitor and a second capacitor may be known with reference to FIGS. 3 and 4, and thus the first and second capacitors are not illustrated for convenience of illustration.

The X-ray detector 400 of FIG. 9 includes a substrate 411, similar to the X-ray detector 300 of FIG. 7. Referring to FIG. 9, a first common electrode 412 is formed on a first surface 410a of a first photoconductor layer 410 which is a silicon substrate. X-rays 'X' are incident on the first surface 410a. A first pixel electrode 438 is formed on a second surface 410b of the first photoconductor layer 410.

A first insulating layer 415 is formed on the first pixel electrode 438. A second common electrode 462 is formed on the first insulating layer 415.

A third insulating layer 413 is formed on the substrate 411. A first gate electrode 432 and a second gate 482 are formed on the third insulating layer 413 so as to be spaced apart from each other. A first electrode (not shown) of the first capacitor and a first electrode (not shown) of the second capacitor are formed on the third insulating layer 413 so as to be at the same vertical position with the first gate electrode 432 and the second gate 482.

A fourth insulating layer 416 covering the first gate electrode 432 and the second gate 482, and the first electrode of the first capacitor and the first electrode of the second capacitor is formed on the third insulating layer 413. A first channel 434 and a second channel 484 are formed on the fourth insulating layer 416.

A first source electrode 435 and a first drain electrode 436 that cover both ends of the first channel 434, and a second source electrode 485 and a second drain electrode 486 that cover both ends of the second channel 484, are formed on the fourth insulating layer 416. Together with these electrodes, a second electrode (not shown) of the first capacitor and a second electrode (not shown) of the second capacitor may be formed on the fourth insulating layer 416.

A passivation layer 417 covering a first transistor 430 and a second transistor 480 is formed on the fourth insulating layer 416. A second pixel electrode 488 is formed on the passivation layer 417. The second pixel electrode 488 is connected to the second source electrode 485 through a conductive plug 487 filling a via hole formed through the passivation layer 417.

The first pixel electrode 438 of the first photoconductor layer 410 is connected to the first source electrode 435 through a conductive plug 437 filling a via hole formed through the first insulating layer 415, the second common electrode 462, a second photoconductor layer 460, and the passivation layer 417.

Since a majority of X-rays incident on the first surface 410a of the first photoconductor layer 410 are absorbed by the first photoconductor layer 410 and the second photoconductor layer 460, a separate block layer for protecting the first transistor 430 and the second transistor 480 from an X-ray is not required. Although, blocking layers may also be provided to protect the first transistor 430 and the second transistor 480 from incident X-rays.

The position and structure of the two transistors in the example embodiments disclosed above may not be limited thereto. For example, in the example embodiment illustrated in FIG. 2, the second transistor 180 and the first transistor 130 may be inverted and/or flipped with respect to each other. Such an inverted transistor may have its gate away from the source of X-rays. Similarly, in the example embodiment illustrated in FIGS. 7 and 9, the second transistors 380, 480 and the first transistors 230, 430 may be inverted and/or flipped with respect to each other.

Also, the x-ray detector, according to example embodiments above, may include two photoconductors and two transistors. However, example embodiments are not limited thereto, and the X-ray detector may include more than two photoconductors and more than two transistors. According to example embodiments, all the transistors may be positioned in a same manner or in a different manner with respect to each other. According to example embodiments, all the transistors may have a same or different structure with respect to each other. Depending on a structure and/or position of the transistors, a blocking layer(s) may or may not be included.

As described above, according to example embodiments, an X-ray detector including double photoconductors may provide an improved image by using image information obtained by respectively detecting X-rays in energy bands having excellent sensitivities with respect to different tissues, for example, cancer tissue and normal tissue, or hard tissue and soft tissue.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A pixel of an X-ray detector, the pixel comprising:
   a first photoconductor configured to generate electron-hole pairs in response to X-rays incident on the first photoconductor;
   a first electrical circuit configured to detect at least one electron or hole generated by the first photoconductor and convert the electron or hole into a first electrical signal, the first electrical circuit including a first transistor;
   a second photoconductor on the first photoconductor, the second photoconductor configured to generate electron-hole pairs in response to X-rays transmitted through the first photoconductor;
   a second electrical circuit configured to detect at least one electron or hole generated by the second photoconductor and convert the electron or hole into a second electrical signal, the second electrical circuit including a second transistor;
   X-ray blocking layers below the first transistor and the second transistor and respectively corresponding to the first transistor and the second transistor;
   a first common electrode and a first pixel electrode respectively on opposite surfaces of the first photoconductor; and a second common electrode and a second pixel electrode respectively on opposite surfaces of the second photoconductor;

wherein the X-rays incident on the first photoconductor are of a lower energy band compared to the X-rays incident on the second photoconductor, wherein the first photoconductor and the second photoconductor are formed of different material from each other, and wherein the first electrical circuit is electrically connected to the first pixel electrode.

2. The pixel of claim 1, wherein the first photoconductor includes silicon.

3. The pixel of claim 1, wherein the first electrical circuit includes a first capacitor.

4. The pixel of claim 3, wherein the second electrical circuit includes a second capacitor, and is electrically connected to the second pixel electrode.

5. The pixel of claim 4,
wherein the X-ray blocking layers are configured to block X-rays from being incident on the first transistor and the second transistor.

6. The pixel of claim 5, wherein the first photoconductor layer includes the X-ray blocking layers.

7. The pixel of claim 5, wherein the X-ray blocking layers include lead (Pb).

8. The pixel of claim 4, wherein a channel of each of the first transistor and the second transistor includes of any one of amorphous silicon, polysilicon, and an oxide semiconductor.

9. The pixel of claim 8, wherein the oxide semiconductor includes ZnO, or a compound including ZnO and at least one selected from a group consisting of gallium (Ga), indium (In), hafnium (Hf), tin (Sn), tantalum (Ta), and yttrium (Y).

10. The pixel of claim 4, further comprising:
a substrate including the first capacitor and the second capacitor on the substrate;
wherein the substrate faces the second photoconductor layer, the first and second transistors, and the first and second capacitors.

11. The pixel of claim 1, wherein the second photoconductor layer includes at least one selected from a group consisting of amorphous selenium (a-Se), $HgI_2$, $PbI_2$, CdTe, CdZnTe, and PbO.

12. The pixel of claim 1, wherein the first photoconductor and the second photoconductor include a tandem structure.

13. An X-ray detector including the pixel of claim 1.

14. A pixel of an X-ray detector, the pixel comprising:
a first photoconductor configured to generate electron-hole pairs in response to X-rays incident on the first photoconductor;
a first electrical circuit on the first photoconductor configured to detect at least one electron or hole generated by the first photoconductor and convert the electron or hole into a first electrical signal, the first electrical circuit including a first transistor;
a second photoconductor on the first photoconductor, the second photoconductor configured to generate electron-hole pairs in response to X-rays transmitted through the first photoconductor;
a second electrical circuit on the first photoconductor configured to detect at least one electron or hole generated by the second photoconductor and convert the electron or hole into a second electrical signal, the second electrical circuit including a second transistor;
X-ray blocking layers below the first transistor and the second transistor and respectively corresponding to the first transistor and the second transistor,
a first common electrode and a first pixel electrode respectively on opposite surfaces of the first photoconductor; and
a second common electrode and a second pixel electrode respectively on opposite surfaces of the second photoconductor;
wherein the X-rays incident on the first photoconductor are of a lower energy band compared to the X-rays incident on the second photoconductor,
wherein the first photoconductor and the second photoconductor are formed of different material from each other,
wherein the first electrical circuit is electrically connected to the first pixel electrode, and
wherein the first and second electrical circuits are between the first and second photoconductors, or wherein the first and second electrical circuits are on the first and second photoconductors.

15. A pixel of an X-ray detector, the pixel comprising:
a first photoconductor configured to generate electron-hole pairs in response to X-rays incident on the first photoconductor;
a first electrical circuit on the first photoconductor configured to detect at least one electron or hole generated by the first photoconductor and convert the electron or hole into a first electrical signal, the first electronic circuit including a first transistor;
a second photoconductor on the first electrical circuit, the second photoconductor configured to generate electron-hole pairs in response to X-rays transmitted through the first photoconductor;
a second electrical circuit configured to detect at least one electron or hole generated by the second photoconductor and convert the electron or hole into a second electrical signal, the second electrical circuit including a second transistor;
X-ray blocking layers below the first transistor and the second transistor and respectively corresponding to the first transistor and the second transistor
a first common electrode and a first pixel electrode respectively on opposite surfaces of the first photoconductor; and
a second common electrode and a second pixel electrode respectively on opposite surfaces of the second photoconductor;
wherein the X-rays incident on the first photoconductor are of a lower energy band compared to the X-rays incident on the second photoconductor,
wherein the first photoconductor and the second photoconductor are formed of different material from each other, and
wherein the first electrical circuit is electrically connected to the first pixel electrode.

* * * * *